United States Patent [19]

Hama

[11] Patent Number: 5,284,793
[45] Date of Patent: Feb. 8, 1994

[54] METHOD OF MANUFACTURING RADIATION RESISTANT SEMICONDUCTOR DEVICE

[75] Inventor: Kaoru Hama, Yokohama, Japan

[73] Assignee: Kabushiki Kaisha Toshiba, Kawasaki, Japan

[21] Appl. No.: 974,662

[22] Filed: Nov. 12, 1992

Related U.S. Application Data

[63] Continuation of Ser. No. 611,310, Nov. 9, 1990, abandoned.

[30] Foreign Application Priority Data

Nov. 10, 1989 [JP] Japan .................. 1-293495

[51] Int. Cl.$^5$ .................................. H01L 21/225
[52] U.S. Cl. .................................. 437/160; 437/37; 437/938
[58] Field of Search ............ 437/37, 45, 160, 164, 437/240, 243, 938, 950; 148/DIG. 34, DIG. 35, DIG. 144

[56] References Cited

U.S. PATENT DOCUMENTS

| | | | |
|---|---|---|---|
| 3,799,813 | 3/1974 | Danchenko | 437/938 |
| 3,887,993 | 6/1975 | Okada et al. | 437/160 |
| 3,999,209 | 12/1976 | Wrigley et al. | 437/160 |
| 4,748,131 | 5/1988 | Zietlow | 437/240 |
| 4,791,074 | 12/1988 | Tsunashima et al. | 437/160 |

FOREIGN PATENT DOCUMENTS

| | | |
|---|---|---|
| 0322921 | 7/1989 | European Pat. Off. . |
| 0068635 | 5/1980 | Japan .................. 437/45 |
| 2130793 | 6/1984 | United Kingdom . |

OTHER PUBLICATIONS

Patent Abstracts of Japan, Unexamined Applications, vol. 11, No. 275 (E-537)[2722], Sep. 5, 1987; Japanese Patent Kokai No. 62-76559, dated Apr. 8, 1987, Toshiba Corp.

Patent Abstracts of Japan, Unexamined Applications, vol. 12, No. 322 (E-652)[3169], Aug. 31, 1988; Japanese Patent Kokai No. 63-86514, dated Apr. 16, 1988, Toshiba Corp.

Patent Abstracts of Japan, Unexamined Applications, vol. 5, No. 3 (E-40)[675], Jan. 10, 1981; Japanese Patent Kokai No. 55-133556, dated Oct. 17, 1980, Matsushita Denshi Kogyo K.K.

S. K. Ghandhi, VLSI Fabrication Principles, pp. 427-429, 1983.

Wolf et al., Silicon Processing For the VLSI Era, pp. 191-193, 1986.

*Primary Examiner*—Brian E. Hearn
*Assistant Examiner*—C. Chaudhari
*Attorney, Agent, or Firm*—Finnegan, Henderson, Farabow, Garrett & Dunner

[57] ABSTRACT

According to this invention, an oxide film is formed on a semiconductor substrate, a metallic boron film or a film containing at least one selected from the group consisting of boron, phosphorus, and arsenic is deposited on the surface of the resultant structure. At least one selected from the group consisting of boron, phosphorus, and arsenic is doped from the metallic boron film or the film containing at least one selected from the group consisting of boron, phosphorus, and arsenic to the oxide film by diffusion without diffusing into the semiconductor substrate. Thus, a semiconductor device having good radiation resistance can be obtained.

6 Claims, 4 Drawing Sheets

METHOD OF MANUFACTURING RADIATION RESISTANT SEMICONDUCTOR DEVICE

This application is a continuation of application Ser. No. 07/611,310, filed Nov. 9, 1990, now abandoned.

BACKGROUND OF THE INVENTION

1. Field of the Invention

The present invention relates to a method of manufacturing a radiation resistant semiconductor device used in, e.g., a space satellite, or a nuclear power plant.

2. Description of the Related Art

It is known that when an ionizing radiation such as an x-ray, a Y-ray, or a high-energy charged particle is radiated onto a semiconductor device, a large amount of electron-hole pairs are created in an oxide film. It is well known that a drift velocity of electrons in an oxide film is higher than that of holes. For this reason, the electrons of the electron-hole pairs generated in an oxide film disappear faster than the holes, and the many holes are left, and some portion of these holes are trapped in the oxide film. Therefore a p-type substrate under the oxide film can be inverted into an n-type one due to these trapped holes. As a consequence, when the positive charges (holes) are trapped in a field oxide film, a leakage current between circuit elements is increased. When the positive charges are trapped in a gate oxide film, a threshold voltage of the transistor is changed. Moreover, in a small-geometry LDD transistor, when many positive charges are trapped in the oxide film formed on side walls of a gate electrode, a strong accumulation of electrons otherwise in a low-electron concentration $n^-$-type region occurs. Therefore, the transistor cannot be operated as an LDD transistor.

As conventional techniques for overcoming the above problem, a guard-band structure is employed to the field oxide film, the field oxide film is formed at a low temperature, or the field oxide film is made of two layers. In addition, it is known that a decrease in thickness and a treatment at a low temperature are effective to hardening of an oxide film.

However, in a semiconductor device having the guard-band structure, since the circuit elements must be arranged in consideration of radiation resistance in a mask design, the design becomes difficult. When the field oxide film is formed at a low temperature, a long time is required for growing the oxide film. Therefore, this method is not practical in the manufacture. In addition, when the oxide film is formed to have two layers, an interface between the two layers disadvantageously disappears by annealing after formation of the oxide film.

As for the oxide film on the side wall of the gate electrode of the LDD transistor, a technique for enhancing radiation resistance has never been developed.

SUMMARY OF THE INVENTION

The present invention is made in consideration of the above drawbacks, and has as its object to provide a method of manufacturing a radiation resistant semiconductor device, capable of manufacturing semiconductor devices having good radiation resistance.

According to an aspect of the present invention, there is provided a method of manufacturing a radiation resistant semiconductor device, comprising the steps of forming an oxide film on a semiconductor substrate, depositing a metallic boron film on the oxide film, and diffusing borons from the metallic boron film to the oxide film by annealing.

According to another aspect of the present invention, there is provided a method of manufacturing a radiation resistant semiconductor device, comprising the steps of forming an element isolation oxide film and a gate insulating oxide film on a semiconductor substrate, depositing a metallic boron film on the element isolation oxide film and the gate insulating oxide film, and diffusing borons from the metallic boron film to the element isolation oxide film and the gate insulating oxide film by annealing.

According to still another aspect of the present invention, there is provided a method of manufacturing a radiation resistant semiconductor device, comprising the steps of depositing a silicon nitride film on a semiconductor substrate, patterning the silicon nitride film to leave the silicon nitride film in a region where an element isolation oxide film is not formed, forming the element isolation oxide film by oxidization, depositing a metallic boron film on the entire surface of the silicon substrate; and diffusing metallic borons from the metallic boron film to the element isolation oxide film by annealing.

According to still another aspect of the present invention, there is provided a method of manufacturing a radiation resistant semiconductor device, comprising the steps of forming a gate electrode on a semiconductor substrate, depositing an oxide film on the gate electrode, depositing a metallic boron film on the oxide film, diffusing borons from the metallic boron film to the oxide film by annealing, and leaving the oxide film on only the side walls of the gate electrode with an anisotropical etching method.

According to still another aspect of the present invention, there is provided a method of manufacturing a radiation resistant semiconductor device, comprising the steps of forming an oxide film on a semiconductor substrate, depositing a film containing at least one selected from a group consisting of boron, phosphorus, and arsenic on the oxide film, and diffusing at least one selected from the group consisting of boron, phosphorus, and arsenic from the film to the oxide film by annealing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Methods of manufacturing a radiation resistant semiconductor device according to the present invention will be described with reference to the accompanying drawings.

FIGS. 1A to 1F are sectional views showing the steps of a first manufacturing method when the present invention is employed to manufacture a MOS transistor.

Figure 1A:
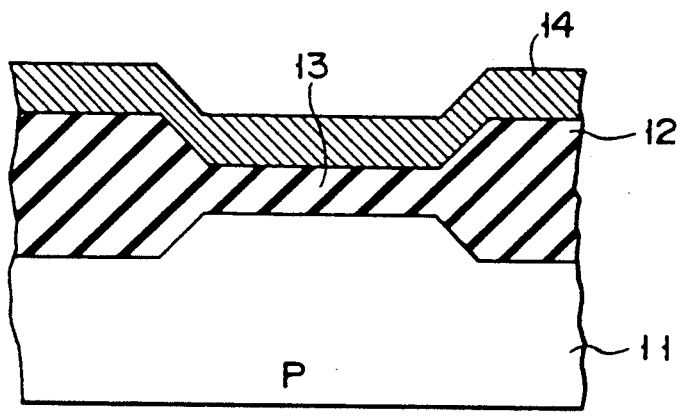
FIGS. 1A to 1F are sectional views showing the steps in a first method of manufacturing a radiation resistant semiconductor device according to the present invention.

As shown in FIG. 1A, a field oxide film 12 and a gate oxide film 13 are formed on a p-type silicon semiconductor substrate 11 by a selective oxidation method, and a polysilicon film 14 is formed thereon by a CVD method (chemical vapor deposition method) or the like.

Figure 1B:
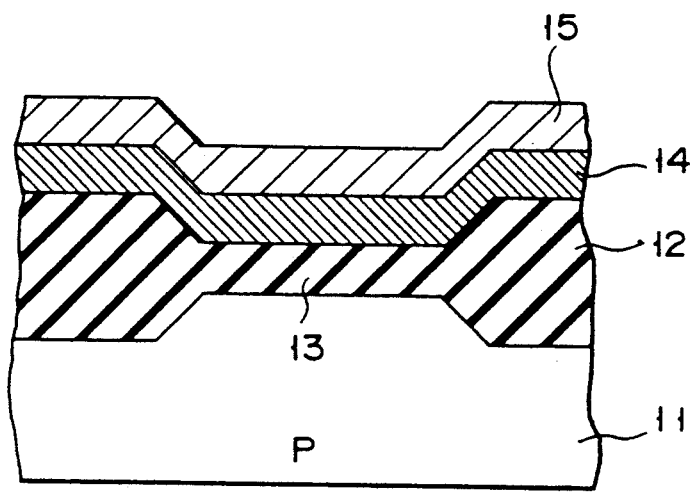

As shown in FIG. 1B, a metallic boron film 15 is deposited on the polysilicon film 14 by a vacuum deposition method to have a thickness of about 0.1 μm.

Figure 1C:
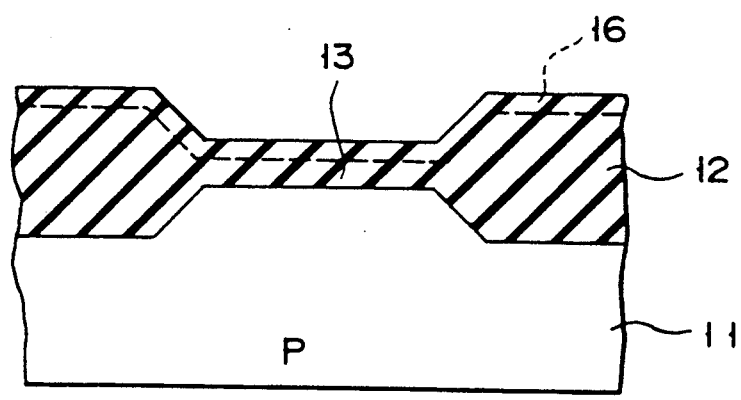

Thereafter, as shown in FIG. 1C, the resultant structure is annealed at a temperature of 900° C. or more in a non-oxidizing atmosphere to diffuse the borons (B) from the metallic boron film 15 to both the field oxide film 12 and the gate oxide film 13 using the polysilicon film 14 as a buffer member, so as to form a boron doped region 16 on the surface of both the field oxide film 12 and the gate oxide film 13. If the metallic borons are doped by an implantation, the oxide films may be seriously damaged by the implanted ions. For this reason, an amount of trapped charges may be more significantly increased than those without implantations. Therefore, according to the present invention, the metallic borons are diffused by annealing. Thereafter, the metallic boron film 15 is removed, and the polysilicon film 14 thereunder is removed to expose the surfaces of the field oxide film 12 and the gate oxide film 13.

Figure 1D:
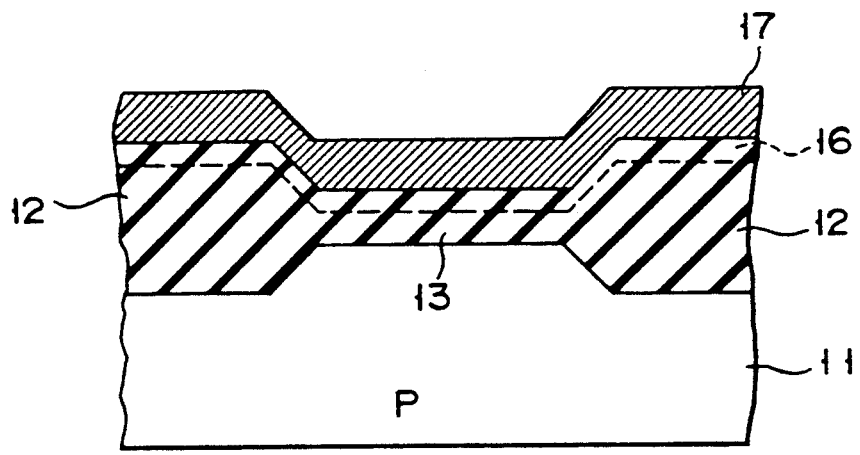

As shown in FIG. 1D, a polysilicon film 17 is deposited on the surface of the field oxide film 12 and the gate oxide film 13, and phosphoruses are doped in the polysilicon film 17. The phosphoruses may have a concentration at which the electric resistance of the gate electrode is satisfactorily low.

Figure 1E:
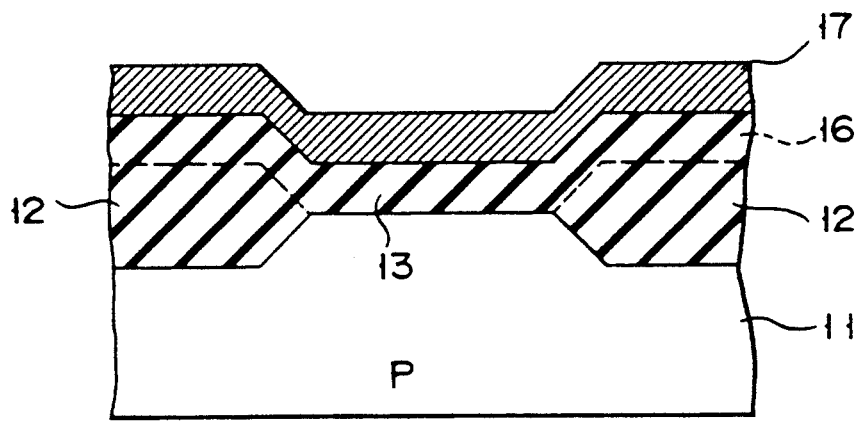

As shown in FIG. 1E, the phosphoruses doped in the polysilicon film 17 are further diffused by annealing. At this time, the borons are diffused from the boron doped region 16 of the field oxide film 12 and the gate oxide film 13. When the borons are diffused near the interface between the gate oxide film 13 and the substrate 11, the diffusion step is stopped. In this embodiment, a time required for the diffusion step is determined in consideration of the thickness of the gate oxide film 13.

Figure 1F:
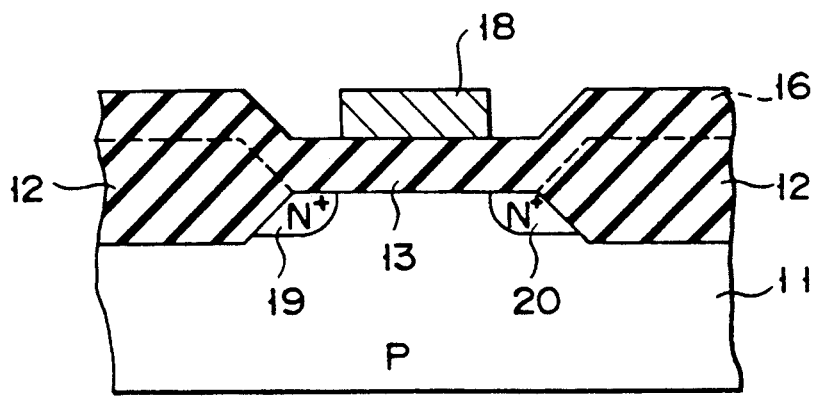

As shown in FIG. 1F, the polysilicon film 17 is patterned using a predetermined mask by a selective etching method to form a gate electrode 18. Thereafter, n-type impurities such as arsenics (As) are implanted in the surface of the substrate 11 and are activated to form a pair of n-type regions 19 and 20 serving as source and drain regions.

In the MOS transistor manufactured by the above first manufacturing method of the present invention, the borons are doped in both the field oxide film 12 and the gate oxide film 13. Electrons generated by radiation exposure are caught once by traps formed by the boron atoms, and then the electrons are recombined with the holes at a high probability. As a result, the number of the holes available for trapping in the field oxide film 12 and the gate oxide film 13 is largely decreased compared with the conventional techniques.

According to the first manufacturing method of the present invention, since a guard-band structure need not be employed, a semiconductor device can be easily designed. In addition, since the field oxide film can be formed at a relatively high temperature, a conventional manufacturing process can be easily applied to easily manufacture a radiation resistant semiconductor device.

Figure 2A:
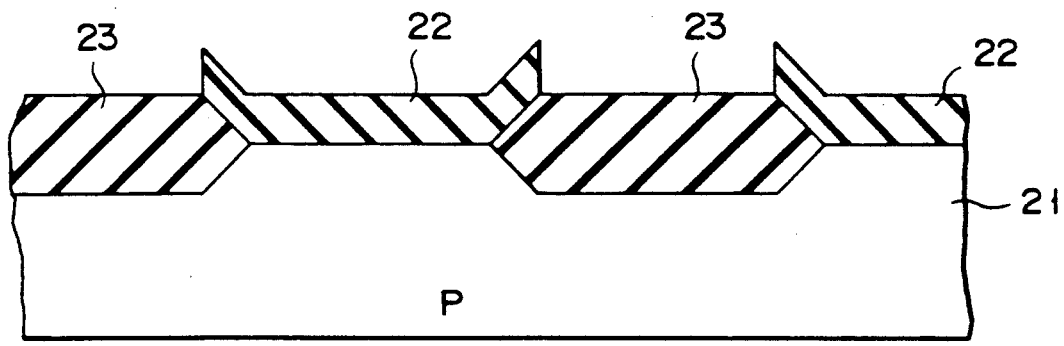
FIGS. 2A to 2C are sectional views showing the steps in a second method of manufacturing a radiation resistant semiconductor device according to the present invention.
Figure 2B:
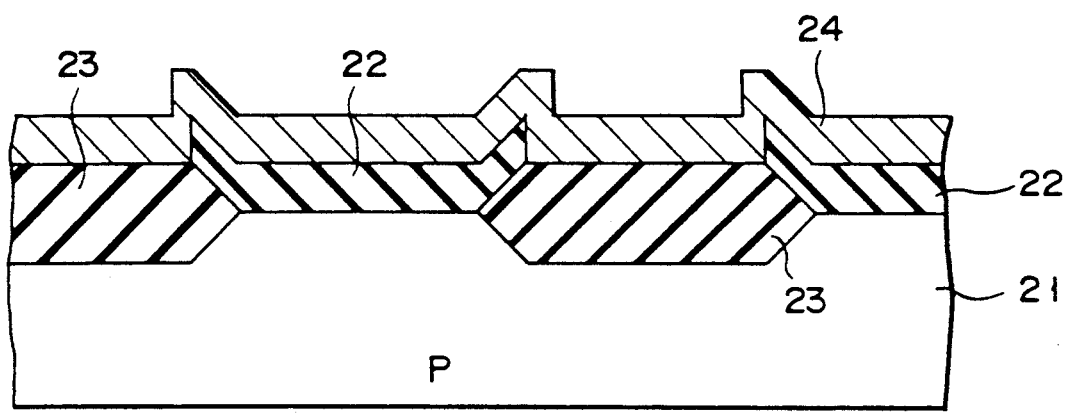
Figure 2C:
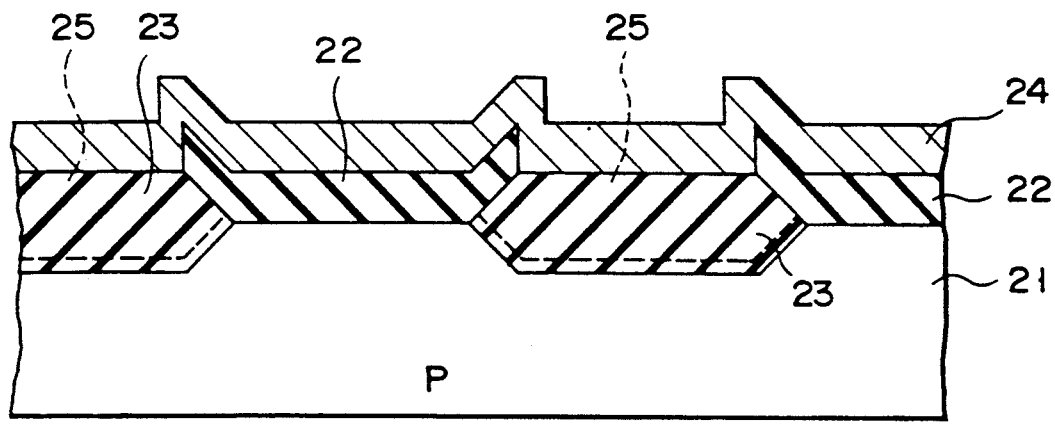

FIGS. 2A to 2C are sectional views showing the steps of a second manufacturing method of the present invention when the present invention is applied to the manufacturing of a MOS transistor with borons doped only in field oxide.

As shown in FIG. 2A, a selective oxidation mask member such as a silicon nitride film 22 having a predetermined pattern is formed on a p-type silicon semiconductor substrate 21. A field oxide film 23 is formed on the substrate 21 by a thermal oxidation method using the silicon nitride film 22 as a mask.

As shown in FIG. 2B, with the silicon nitride film 22 left unremoved, a metallic boron film 24 is deposited on an entire surface of the resultant structure by a vacuum deposition method or the like to have a thickness of about 0.1 μm.

As shown in FIG. 2C, the resultant structure is annealed in a non-oxidizing atmosphere at a temperature of 900° C. or more to diffuse the borons from the metallic boron film 24 to the field oxide film 23 so as to form a boron doped region 25. In this embodiment, a time required for the diffusion step is determined in consideration of the thickness of the field oxide film 23. Since the silicon nitride film 22 is left on the surface of the substrate 21 where the field oxide film 23 is not formed, the borons are not diffused in the substrate 21.

Thereafter, the metallic boron film 24 and the silicon nitride film 22 are removed to expose the surfaces of the field oxide film 23 and the substrate 21. Therefore, a gate oxide film is formed, and a gate electrode and a pair of n+-type regions (neither are shown) serving as source and drain regions are formed.

According to the second manufacturing method of the present invention, since the borons are doped in the field oxide film 23 by diffusion step before the gate oxide film is formed, the borons can be diffused in the field oxide film to a sufficiently deep depth without considering the thickness of the gate oxide film which is generally thinner than the field oxide film. Therefore, the holes trapped in the field oxide film 23 can be extremely reduced.

Note that, in the second manufacturing method of the present invention, after the gate oxide film is formed, the borons may be doped in the gate oxide film in another step.

FIGS. 3A to 3D are sectional views showing a third manufacturing method of the present invention when the present invention is applied to the manufacturing of a small-geometry LDD transistor.

Figure 3A:
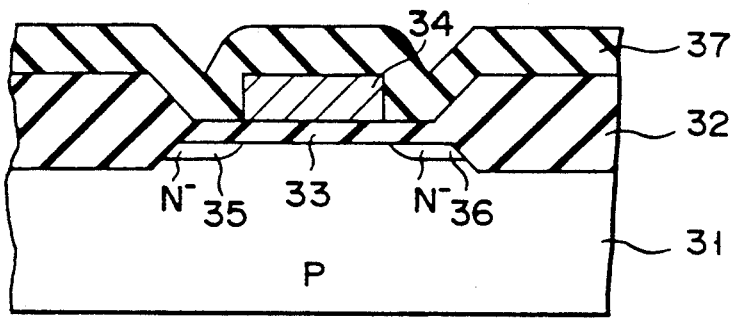
FIGS. 3A to 3D are sectional views showing the steps in a third method of manufacturing a radiation resistant semiconductor device according to the present invention.

As shown in FIG. 3A, a field oxide film 32 and a gate oxide film 33 are formed on a p-type silicon semiconductor substrate 31 by a thermal oxidation method. A gate electrode 34 made of a polysilicon film is formed on the gate oxide film 33. Thereafter, a pair of n−-type regions 35 and 36 are formed on the surface of the substrate 31 by an ion-implantation method using the field oxide film 32 and the gate electrode 34 as masks. An oxide film 37 is deposited on an entire surface of the resultant structure by a CVD method.

Figure 3B:
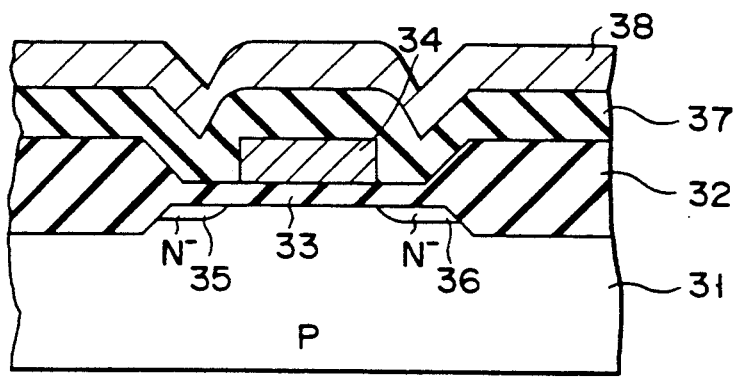

As shown in FIG. 3B, a metallic boron film 38 is deposited on the oxide film 37 by a vacuum deposition method or the like to have a thickness of about 0.1 μm.

Figure 3C:
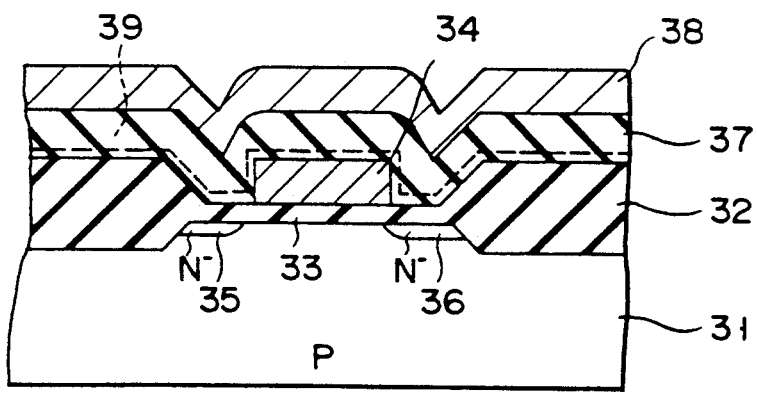

As shown in FIG. 3C, the resultant structure is annealed in a non-oxidizing atmosphere at a temperature of 900° C. or more to diffuse the borons from the metallic boron film 38 to the oxide film 37 so as to form a boron doped region 39.

Figure 3D:
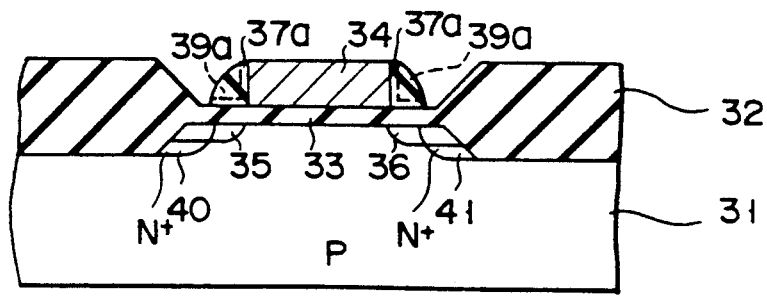

As shown in FIG. 3D, after the metallic boron film 38 is removed, the oxide film 37 is etched by an anisotropic etching method such as a reactive ion etching (RIE) method to leave the oxide film 37 on only each side wall 37a of the gate electrode 34. Thereafter, a pair of n+-type regions 40 and 41 are formed on the surface of the substrate 31 by the ion-implantation method using the field oxide film 32, the gate electrode 34, and the side wall 37a as masks.

As described above, according to the third manufacturing method of the present invention, the borons can be doped in the silicon oxide film 37 formed on the side walls 37a of the gate electrode 34 so that the radiation resistance of the side wall oxides are improved.

The present invention is not limited to the above embodiments, and various modifications can be effected. For example, in each embodiment described above, although the metallic boron film is deposited on the oxide film in which the borons should be doped, "a film containing boron" such as a borosilicate glass (BSG) film can be deposited. In each embodiment described above, although a case wherein the borons are doped from the metallic boron film to the oxide film and then the metallic boron film is removed is described, the film containing boron may be left unremoved if such film is very thin. In the above embodiments, the metallic boron film or the "film containing metallic boron" has been used. However, when a film containing at least one selected from a group consisting of phosphorus and arsenic, a film containing two elements selected from the group consisting of metallic boron, phosphorus and arsenic, or a film containing metallic boron, phosphorus, and arsenic may be used in place of the "film containing boron", the same effect as described above can be obtained.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a radiation resistant semiconductor device, comprising the steps of:
   forming an element isolation oxide film and a gate insulating oxide film on a semiconductor substrate;
   depositing a film containing one of phosphorus and arsenic on said element isolation oxide film and said gate insulating oxide film, with said film being physically separated from said substrate; and
   diffusing said one of phosphorus and arsenic from said film into said element isolation oxide film and the gate insulating oxide film by annealing without diffusing said one of phosphorus and arsenic into said substrate.

2. A method of manufacturing a radiation resistant semiconductor device, comprising the steps of:
   depositing a silicon nitride film on a semiconductor substrate;
   patterning said silicon nitride film to leave said silicon nitride film in a substrate region where an element isolation oxide film is not formed;
   forming said element isolation oxide film by oxidization;
   depositing a film containing one of phosphorus and arsenic on a surface of said element isolation oxide film, with said film being physically separated from said substrate; and
   diffusing said one of phosphorus and arsenic from said film into said element isolation oxide film by annealing without diffusing said one of phosphorus and arsenic into said substrate.

3. A method of manufacturing a radiation resistant semiconductor device, comprising the steps of:
   forming a gate electrode on a semiconductor substrate;
   depositing an oxide film on said gate electrode;
   depositing a film containing one of phosphorus and arsenic on said oxide film, with said film being physically separated from said substrate;
   diffusing said one of phosphorus and arsenic from said film into said oxide film by annealing without diffusing said one of phosphorus and arsenic into said substrate; and
   removing said oxide film from said gate electrode while leaving a portion of said oxide film on only side walls of said gate electrode.

4. A method of manufacturing a radiation resistant semiconductor device, comprising the steps of:
   forming an element isolation oxide film and a gate insulating oxide film on a semiconductor substrate;
   depositing a film containing at least one element selected from a group consisting of phosphorus and arsenic on said element isolation oxide film and said gate insulating oxide film, with said film being physically separated from said substrate; and
   diffusing said at least one selected element from said film into said element isolation oxide film and said gate insulating oxide film by annealing without diffusing said at least one selected element into said substrate.

5. A method of manufacturing a radiation resistant semiconductor device, comprising the steps of:
   depositing a silicon nitride film on a semiconductor substrate;
   patterning said silicon nitride film to leave said silicon nitride film in a region wherein an element isolation oxide film is not formed;
   forming said element isolation oxide film by oxidation;
   depositing a film containing at least one element selected from a group consisting of phosphorus and arsenic on a surface of said element isolation film, with said film being physically separated from said substrate; and
   diffusing said at least one selected element from said film into said element isolation oxide film by annealing without diffusing said at least one selected element into said substrate.

6. A method of manufacturing a radiation resistant semiconductor device, comprising the steps of:
   forming a gate electrode on a semiconductor substrate;

depositing an oxide film on said gate electrode;
depositing a film containing at least one element selected from a group consisting of phosphorus an arsenic on said oxide film, with said film being physically separated from said substrate;
diffusing said at least one selected element from said film into said oxide film by annealing without diffusing said at least one selected element into said substrate; and
removing said oxide film from said gate electrode while leaving a portion of said oxide film on only side walls of said gate electrode.

* * * * *